US006890413B2

United States Patent
Cheng et al.

(10) Patent No.: US 6,890,413 B2
(45) Date of Patent: May 10, 2005

(54) METHOD AND APPARATUS FOR CONTROLLING LOCAL CURRENT TO ACHIEVE UNIFORM PLATING THICKNESS

(75) Inventors: Tien-Jen Cheng, Bedford, NY (US); Todd M. Fowler, Poughkeepsie, NY (US); Ajay P. Giri, Poughkeepsie, NY (US); Anton Nenadic, Red Hook, NY (US); Blessen Samuel, Mount Vernon, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 10/318,607
(22) Filed: Dec. 11, 2002
(65) Prior Publication Data US 2004/0115932 A1 Jun. 17, 2004

(51) Int. Cl.⁷ .................................................. C25D 5/00
(52) U.S. Cl. ..................... 205/96; 205/97; 205/118; 205/125; 205/135
(58) Field of Search .................................. 205/118, 125, 205/135, 96, 97

(56) References Cited

U.S. PATENT DOCUMENTS

2003/0168340 A1 * 9/2003 Kaja et al. ................... 205/96

OTHER PUBLICATIONS

U.S. Appl. No. 09/699,909, Kaja et al., filed Oct. 30, 2002.

* cited by examiner

Primary Examiner—Wesley A. Nicolas
(74) Attorney, Agent, or Firm—DeLio & Peterson LLC; Peter W. Peterson, Esq.; Ira D. Blecker, Esq.

(57) ABSTRACT

A process for electroplating metallic features of different density on a surface of a substrate comprises providing an electroplating bath having an anode, immersing the substrate into the electroplating bath, spaced from the anode, the substrate comprising a cathode. Positioned in the electroplating bath between the substrate and the anode, and adjacent to and separated from the substrate surface is a second cathode that includes a wire mesh screening portion having openings of different sizes conforming to the metallic features to be electroplated. The second cathode screening portion has openings of larger size adjacent areas of higher density of features to be electroplated and openings of smaller size adjacent areas of lower density of features to be electroplated. The process further includes impressing a current through the electroplating bath between the substrate and the anode, and between the second cathode and the anode, and electroplating the metallic features of different density onto the substrate.

13 Claims, 4 Drawing Sheets

METHOD AND APPARATUS FOR CONTROLLING LOCAL CURRENT TO ACHIEVE UNIFORM PLATING THICKNESS

BACKGROUND OF THE INVENTION

1. Field of the Invention

This invention relates to a method and apparatus for electroplating metals onto a substrate, for example, fine features used in the electronics field, and, in particular, to improving the uniformity of electroplating feature thickness across regions of different feature density.

2. Description of Related Art

The electrical performance of a multi-chip module (MCM) is strongly influenced by the thickness distribution of interconnect metal, i.e., the thickness of deposited metal forming the particular interconnect feature. Circuit pattern densities are not always uniformly distributed on a carrier surface. In some areas, the patterns can be very dense, for example where the wires or other features are relatively closely spaced, while in other areas, the patterns can be very isolated, where the wires or features are spaced relatively far apart. Using prior art plating tools and processes, the plated metal thickness can vary significantly. The resultant thin film interconnect structure of nonuniform thickness can severely impact the electrical performance and the production yields due to high standard deviation of parametric measurements. These may be found in other electronics applications, for example, printed circuit boards and magnetic recording heads.

Paddle cells have been used which employ separate power supplies to impress a current between an anode and the cathode comprising the substrate (workpiece) to be plated, and a current between the anode and a secondary cathode, or thief ring, which surrounds the substrate. Traditionally, plating in a paddle cell is controlled only by adjusting substrate and thief currents. There is little control on the local currents on a substrate. Another method to achieve uniformity includes creating dummy pads in the isolated areas. However, it may generate more electrical performance issue. Another approach was employed in Kaja et al. U.S. Ser. No. 09/699,909, filed on Oct. 30, 2000, which disclosed the use of a woven metallic mesh of uniform spacing placed over the substrate and electrically connected to the thief plate. While the Kaja et al. method worked well in its intended use to plate only very few lines on a substrate, it did not to solve the thickness uniformity problem for areas having different feature density.

SUMMARY OF THE INVENTION

Bearing in mind the problems and deficiencies of the prior art, it is therefore an object of the present invention to provide a method and apparatus for improving electroplating on substrates having different density of features to be plated.

It is another object of the present invention to provide a method and apparatus for improving uniformity of electroplating thickness between regions of different feature density.

It is yet another object of the present invention to provide a method to locally influence plating currents for wide range of plating patterns to achieve uniform or intentional non-uniform thicknesses by design.

The above and other objects and advantages, which will be apparent to one of skill in the art, are achieved in the present invention which is directed to, in a first aspect, a process for electroplating metallic features of different density on a surface of a substrate comprising providing an electroplating bath having an anode therein, immersing the substrate into the electroplating bath, spaced from the anode, the substrate comprising a cathode, and positioning into the electroplating bath between the substrate and the anode, and adjacent to and separated from the substrate surface, a second cathode. The second cathode includes a screening portion having openings of different sizes conforming to the metallic features to be electroplated. The second cathode screening portion has openings of larger size adjacent areas of higher density of features to be electroplated and has openings of smaller size adjacent areas of lower density of features to be electroplated. The process further includes impressing a current through the electroplating bath between the substrate and the anode, and between the second cathode and the anode, and electroplating the metallic features of different density onto the surface of the substrate.

The process preferably further includes determining density of features to be electroplated by obtaining a plan of features to be electroplated, defining different areas on the plan of features, and calculating fraction of area to be plated on the different areas on the plan of features. The process then further includes constructing the second cathode by creating a mesh having openings of different sizes corresponding to the calculation of fraction of area to be plated on the different areas on the plan of features.

In another aspect, the present invention is directed to a method of making second cathode screens for use in a process for electroplating metallic features of different density on a surface of a substrate comprising providing a pattern or plan of metallic features of different density to be electroplated onto a surface, identifying different areas of predetermined size on the pattern and determining for each of the identified areas a fraction of the area to be electroplated. The method then includes determining differences, if any, of the fraction of the area to be electroplated for adjacent areas and identifying different densities of metallic features to be electroplated based on differences between adjacent areas of fraction of the area to be electroplated. The method subsequently includes forming a second cathode screen having openings of larger size adjacent areas of higher density of features to be electroplated and having openings of smaller size adjacent areas of lower density of features to be electroplated.

In yet another aspect, the present invention is directed to an apparatus for electroplating metallic features of different density on a surface of a substrate comprising an electroplating bath having an anode therein, a substrate to be plated comprising a cathode immersed in the electroplating bath, and spaced from the anode, and a second cathode. The second cathode includes a screening portion having openings of different sizes conforming to the metallic features to be electroplated disposed in the electroplating bath between the substrate and the anode, and adjacent to and separated from the substrate surface. The second cathode screening portion has openings of larger size adjacent areas of higher density of features to be electroplated and has openings of smaller size adjacent areas of lower density of features to be electroplated. The apparatus further includes a first voltage source for impressing a current through the electroplating bath between the substrate and the anode and a second voltage source for impressing a current through the electroplating bath between the second cathode and the anode.

Preferably, the second cathode comprises a wire mesh and the openings on the second cathode screen comprise spacing between wire in the wire mesh, such that the mesh has openings between the wires of larger size adjacent the areas of higher density of features to be electroplated and has openings between the wires of smaller size adjacent areas of lower density of features to be electroplated. More preferably, the wire mesh is made of wire of about 0.001 to 0.05 in. diameter.

The metallic features to be electroplated comprise metallic wires of different spacing, and the areas of higher density of features to be electroplated comprise metallic wires of closer spacing and the areas of lower density of features to be electroplated comprise metallic wires of larger spacing. Preferably, the openings of larger size in the second cathode screening portion are of reduced size compared to adjacent areas of higher density of features to be electroplated.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
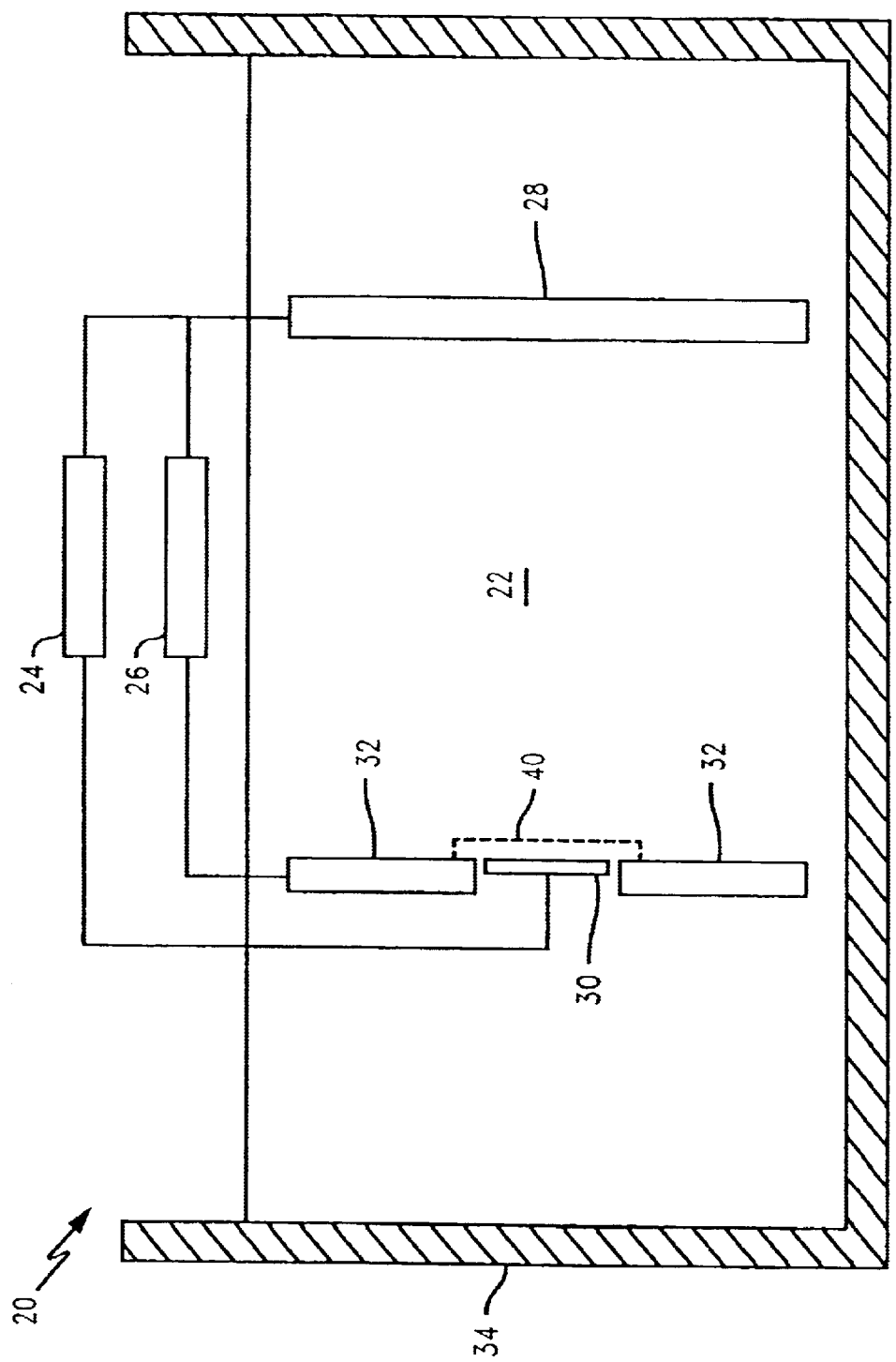
FIG. 1 is a cross-sectional, side elevational view of an electroplating bath employing the preferred screening portion of the secondary cathode of the present invention comprising a wire mesh with cutouts made in accordance with substrate feature density.

In describing the preferred embodiment of the present invention, reference will be made herein to FIGS. 1–5 of the drawings in which like numerals refer to like features of the invention. Features of the invention are not necessarily shown to scale in the drawings.

To improve the electrical test yields on plated substrates having a variety of plating feature densities, the present invention provides a method and apparatus to minimize the thickness nonuniformity during electroplating for a broad range of pattern densities. The present invention involves the use a secondary cathode having a screening portion preferably made of metal mesh screen that overlays on top of the substrate during plating. The mesh screen covers only those areas with sparse lines and leaves openings for areas with dense lines. During plating, the local current density on sparse line area is reduced due to the over potential generated by plating on mesh which is electrically connected to a secondary power supply. The current density on the dense area, on the other hand, is increased since the overall plating current to the substrate is fixed. By manipulating the shape of the screening portion cut-outs and the current flowing to the mesh, thickness uniformity of metal line can be improved.

FIG. 1 depicts the plating apparatus useful in connection with the practice of the method of the present invention. An otherwise conventional plating tank 34 contains a plating solution or bath 22 of conventional composition for the type of features to be electroplated on the substrate. Immersed in the plating bath is an anode 28, a substrate or workpiece 30 as a cathode, and a thief plate 32 as a secondary cathode. A power supply 24 is connected between anode 28 and substrate 30 in order to create a voltage differential and impress a current through the plating bath between the anode and substrate. Thief plate 32 surrounds substrate 30 and is connected by a separate power supply 26 to anode 28. A voltage potential is created by power supply 26 between thief plate 32 and anode 28 to impress a different current value. As the current flow between the anode and the substrate and the anode and the thief plate, the metallic features are plated on the substrate.

Figure 2:
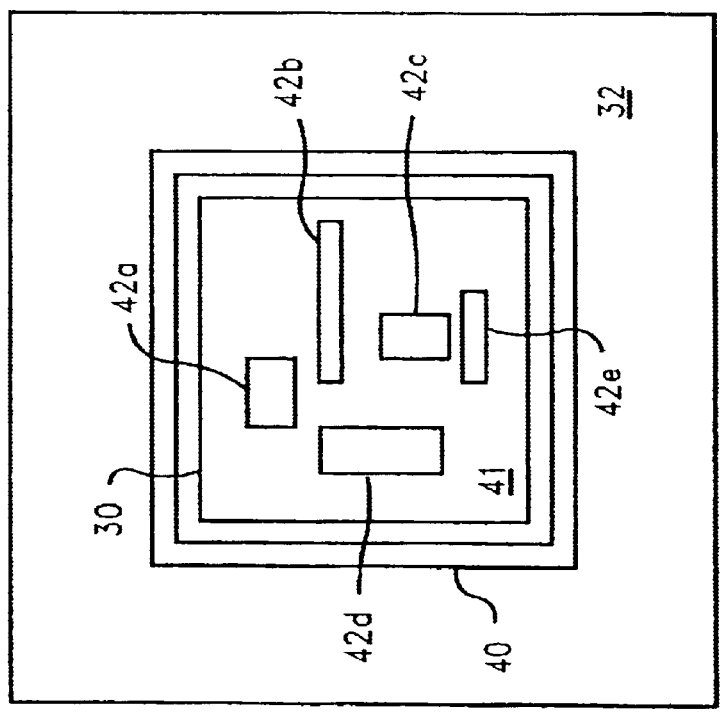
FIG. 2 is a front elevational view showing the substrate and secondary cathode wire mesh of FIG. 1.

In accordance with the method of the present invention, there is positioned in the electro-plating bath between the substrate and the anode, a screening portion 40 of the secondary cathode. The screening portion of the secondary cathode can be made from a wide variety of conductive materials. More preferably when wire mesh is employed, the wire comprises stainless steel, copper or the like. The screening portion 40 is adjacent to and spaced from the surface of substrate 30 and, as seen in FIG. 2, preferably comprises a wire mesh having a series of openings 42a, 42b, 42c, 42d and 42e of larger size than the surrounding mesh pattern of 41. As will be explained further below, these openings 42a–e are formed over and adjacent the areas of the substrate which have plating features of higher density, as compared to other areas having lower density. The size of the openings may vary between areas of different density. Preferably, the size of the particular openings is determined by an algorithm which uses the gradient of density difference between adjacent areas to determine whether and where an opening in the mesh 41 should be created.

Figure 3:
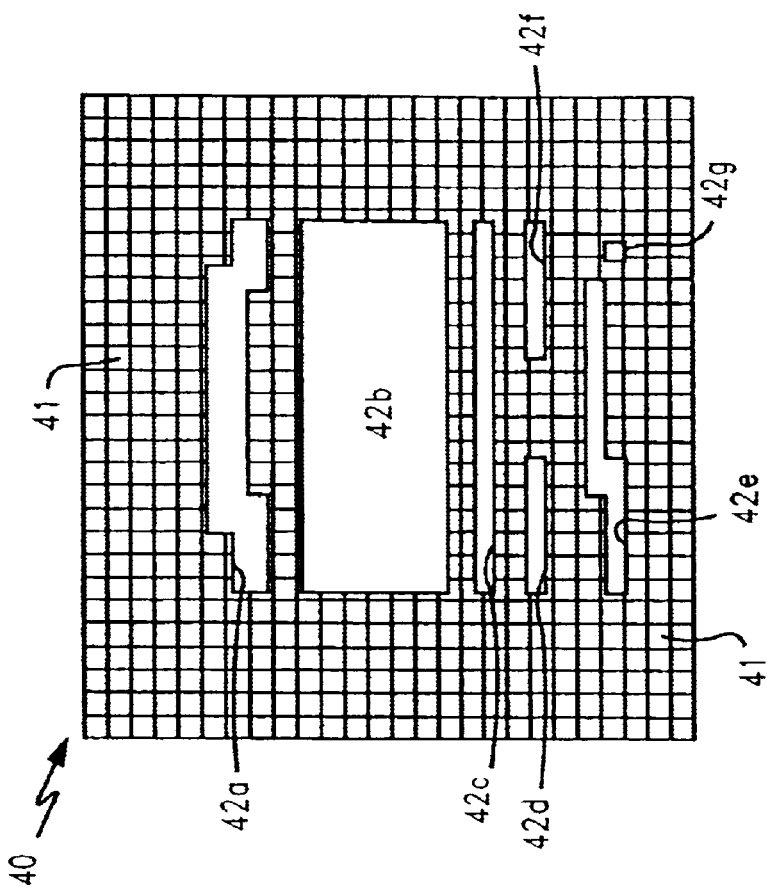
FIG. 3 is front elevational view of another secondary cathode wire mesh with cutouts in accordance with the present invention.

A further example of a screening portion 40 of the secondary cathode made in accordance with the invention is shown in FIG. 3. A wire mesh 41 of relatively small wire spacing has formed within it openings 42a–g of larger size. These openings 42a–g are disposed when used in the plating bath of FIG. 1, over the areas of higher density on the substrate to be electroplated. The mesh wire size may range from 0.001" to 0.05" in diameter, and typically has about 35 to 68% of the area as openings. Other wire sizes and openings are as well applicable according to plating features. In addition to woven mesh, other kinds of masks, e.g. perforated metal sheets, can also be used as materials for the secondary cathode, or mesh thief.

The screening portion of the secondary cathode provides an additional control over local plating currents. The method to determine the size and number of openings of mesh is described in the following examples. The local currents would be modified to achieve uniformity or "non-uniformity", as required by applications. The algorithm used to determine the particular secondary cathode cutouts takes into account the different densities of features to be electroplated on the substrate. On a plan or chicklet showing the features such as lines or wires to be electroplated, one would first define areas or grids on the chicklet by overlaying a repeated concentric pattern, e.g., squares, with a predetermined size according to the plating pattern. For each area defined by the repeated pattern, one would calculate the fraction or percent of the area to be plated, defined as the plated area divided by the total area. From these repeated measurements over the plan one would then identify relatively dense areas and relatively isolated or non-dense areas. Then, between each adjacent area, one would calculate the difference or percent of change of area to be plated, and establish a gradient of pattern density change, for example, as either sharp, mild or very mild, or any other relative description. The secondary cathode would then be made by creating mesh openings on the relatively dense areas of plating, as established by a gradient indicating a relatively sharp difference in pattern density between adjacent areas.

Figure 4:
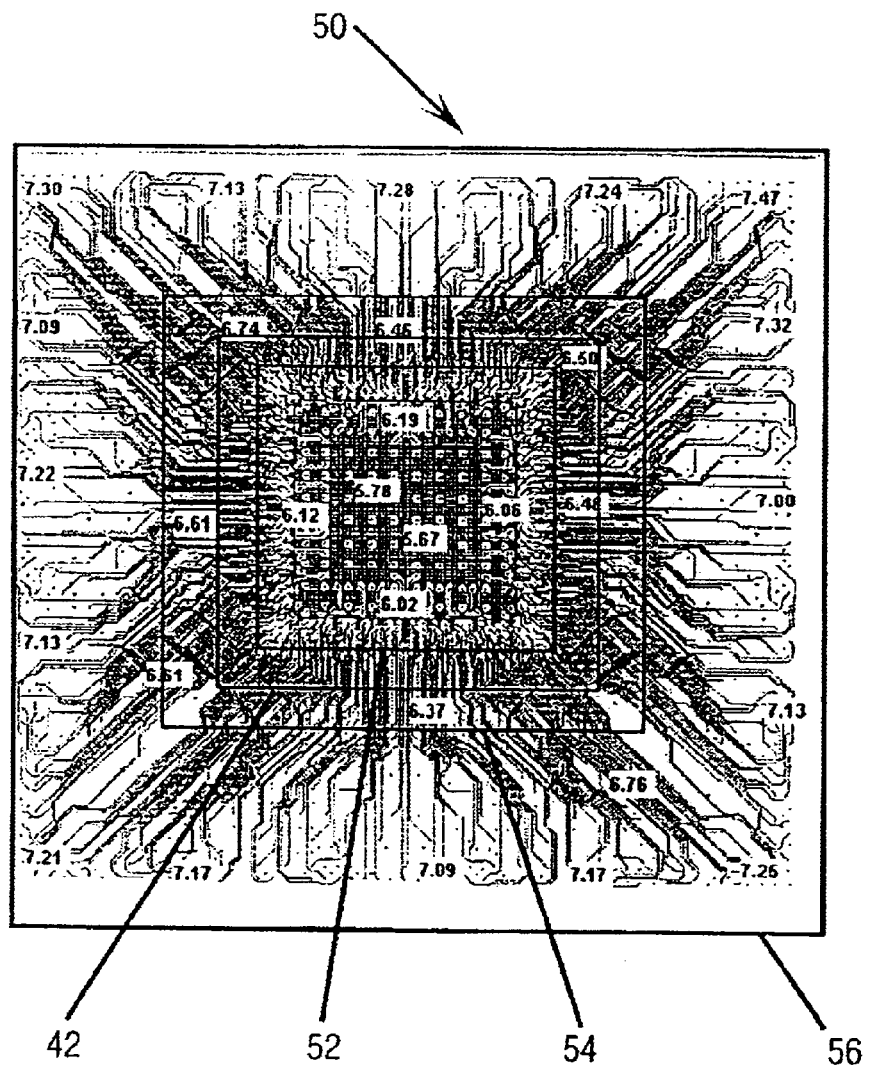
FIG. 4 is a top plan view of the plan of SCM features to be electroplated onto a substrate and the identified areas for determining density of the features in accordance with the present invention, also showing plating thickness without using the secondary cathode of the present invention.
Figure 5:
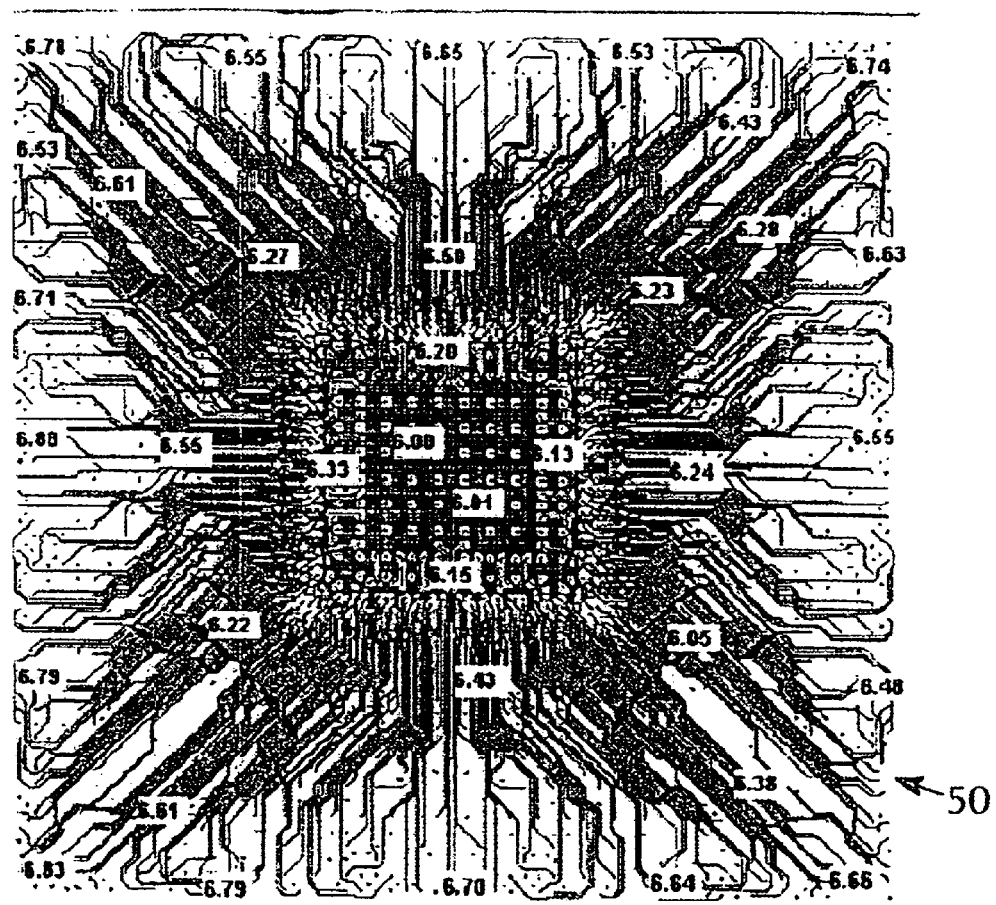
FIG. 5 is a top plan view of the plan of SCM features to be electroplated onto a substrate, showing plating thickness after using the secondary cathode of the present invention.

In a first example, the preparation of a secondary cathode for a single chip module (SCM) 50 to be plated is depicted in Table 1 and FIG. 4. SCM 50 is 27 mm on a side and shows the features actually electroplated on the SCM. A grid of squares had been previously placed over a plan of the features to be electroplated, and the fraction or percent of the area to be plated was determined for each square. For example, in the SCM of overall size 27 mm on a side depicted here, the squares may have a size of 0.5 mm. In a larger substrate, for example a multi-chip module (MCM) or large panel (LP) of overall size 110 mm or more on a side, the grid size may be 1 mm. After comparing the change in plating density between adjacent squares of the SCM in FIG. 4, it was determined that a concentric square area 52, which was 13 mm on a side, identified an area with a density of 41% of the area to be plated and was designated as the most dense area of the plan. It was also determined that a concentric square area 54 of 17 mm on a side identified an area between squares 52 and 54 having a density of 35% of the area to be plated, which was slightly less dense than square 52. Finally, the area between square 54 and square 56 (27 mm on a side) had the lowest density, 8% of the area to be plated, and was designated as an isolated area. Table 1 below indicates these measurements, as well as the percent change of density between adjacent areas bounded by squares 52 and 54.

TABLE 1

| L (Length of Side of Square) | % Area Plated | % Change between Adjacent Areas |
| --- | --- | --- |
| 13 mm | 41% | 6% |
| 17 mm | 35% (dense area) | 27% |
| 27 mm | 8% (isolated area) | |

Table 2 below shows the characterization of the relative differences in densities of areas to be plated for SCM 50 in FIG. 4. A 0–10% change in plating density was characterized as very mild, a 10–25% change in density was characterized as mild, and a change in density greater than 25% was characterized as sharp.

TABLE 2

| % Change between Adjacent Areas | Gradient | L (mm) of Square |
| --- | --- | --- |
| 0–10 | very mild | 13 |
| 10–25 | mild | |
| 26 or higher | sharp | 17 |

Because of the sharp gradient of 27% difference in pattern density along the boundary of square 54 (17 mm on a side), it was determined that a mesh opening would be created adjacent that area. The actual mesh opening was calculated by reducing the size of the opening compared to the size of the area exhibiting the sharp gradient, so that the mesh would cover a portion along the edges of the dense area to balance the convective flow of electroplating solution on the features during plating. For example, a size reduction of up to 50% or more may be employed, for example about 10 to 20%, or 20 to 50% less, as may be readily determined by those of ordinary skill in this art without undue experimentation. In the example of FIG. 4, the mesh opening was reduced about 15%, or 2.5 mm from the 17 mm size of square 54, to arrive at a mesh opening of 14.5 mm.

The final plating thickness, in micrometers ($\mu$m), on SCM 50 as plated without the secondary cathode of the present invention is shown on the different areas of the SCM in FIG. 4. By way of comparison, the final plating thickness as plated using the secondary cathode of the present invention is shown on the different areas of SCM 50 in FIG. 5. The uniformity of plating thickness is much improved in the SCM of FIG. 5.

Other tests have also shown improvement in plating thickness uniformity in substrates having different plating densities, as described in Table 3 below showing a comparison of copper plating thickness uniformity between a substrate plating using thief ring without a mesh, a solid mesh in accordance with the Kaja et al. application, and a mesh with cutouts made in accordance with the present invention:

TABLE 3

| Average Cu Thickness ($\mu$m) | No Mesh | Mesh without cut-outs (Kaja et al.) | Mesh with cut-outs (Invention) |
| --- | --- | --- | --- |
| Dense area (center) | 5.06 | 5.02 | 5.60 |
| Dense area (edge) | 6.17 | 6.21 | 5.83 |
| Isolated area | 6.63 | 6.49 | 5.65 |
| Corner/perimeter | 6.13 | 6.32 | 5.77 |
| Max–Min | 1.57 | 1.47 | 0.23 |

The measurements of average Cu thickness show much less deviation in the method of the present invention as compared with prior methods. Other data has shown that the average thickness distribution between dense and sparse areas has been improved from 28% to 4% on an MCM, and from 25% to 12% on a SCM.

The dramatic improvement of thickness control enabled by this invention also leads to a very significantly tighter distribution in final parametric performance of SCM and MCM modules, as well as, increased yields. A summary of electrical measurements on MCM modules plated in accordance with the prior art method of using the thief ring without a mesh, and the method of the present invention is shown below in Table 4:

TABLE 4

| | Parametric average | Standard deviation |
| --- | --- | --- |
| MCM (w/o mesh) | 2.135 | 0.1153 |
| MCM (Pres. Invention) | 2.193 | 0.0753 |

The electrical performance can be improved since there is a 35% reduction in standard deviation. This method has also been demonstrated on other MCM and SCM products as well.

The process of the present invention may be used for electroplating a variety of industrial plating applications, for example, printed circuit board/laminates, hyper ball grid arrays (BGAs) plating, surface laminar circuits (SLCs), electroformed masks, and thin film inductive magnetic recording heads.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A process for electroplating metallic features of different density on a surface of a substrate comprising:

providing an electroplating bath having an anode therein;

immersing the substrate into the electroplating bath, spaced from the anode, the substrate comprising a cathode;

positioning into the electroplating bath between the substrate and the anode, and adjacent to and separated from the substrate surface, a second cathode including a screening portion having openings of different sizes conforming to the metallic features to be electroplated, the second cathode screening portion having openings of larger size adjacent areas of higher density of features to be electroplated and having openings of smaller size adjacent areas of lower density of features to be electroplated; and impressing a current through the electroplating bath between the substrate and the anode, and between the second cathode and the anode, and electroplating the metallic features of different density onto the surface of the substrate.

2. The process of claim 1 wherein the second cathode comprises a wire mesh.

3. The process of claim 1 wherein the second cathode screening portion comprises a wire mesh, the mesh having openings between the wires of larger size adjacent the areas of higher density of features to be electroplated and having openings between the wires of smaller size adjacent areas of lower density of features to be electroplated.

4. The process of claim 1 wherein the metallic features to be electroplated comprise metallic wires of different spacing, and the areas of higher density of features to be electroplated comprise metallic wires of closer spacing and the areas of lower density of features to be electroplated comprise metallic wires of larger spacing.

5. The process of claim 2 wherein the wire mesh is made of wire of about 0.001 to 0.05 in. diameter.

6. The process of claim 1 wherein the openings of larger size in the second cathode screening portion are of reduced size compared to adjacent areas of higher density of features to be electroplated.

7. A process for electroplating metallic features of different density on a surface of a substrate comprising:

determining density of features to be electroplated by obtaining a plan of features to be electroplated, defining different areas on the plan of features, and calculating fraction of area to be plated on the different areas on the plan of features;

providing an electroplating bath having an anode therein;

immersing the substrate into the electroplating bath, spaced from the anode, the substrate comprising a cathode;

positioning into the electroplating bath between the substrate and the anode, and adjacent to and separated from the substrate surface, a second cathode including a screening portion having openings of different sizes conforming to the metallic features to be electroplated, the second cathode screening portion having openings of larger size adjacent areas of higher density of features to be electroplated and having openings of smaller size adjacent areas of lower density of features to be electroplated; and impressing a current through the electroplating bath between the substrate and the anode, and between the second cathode and the anode, and electroplating the metallic features of different density onto the surface of the substrate.

8. The process of claim 7 wherein the second cathode comprises a wire mesh.

9. The process of claim 7 wherein the second cathode screening portion comprises a wire mesh, the mesh having openings between the wires of larger size adjacent the areas of higher density of features to be electroplated and having openings between the wires of smaller size adjacent areas of lower density of features to be electroplated.

10. The process of claim 7 wherein the metallic features to be electroplated comprise metallic wires of different spacing, and the areas of higher density of features to be electroplated comprise metallic wires of closer spacing and the areas of lower density of features to be electroplated comprise metallic wires of larger spacing.

11. The process of claim 8 wherein the wire mesh is made of wire of about 0.001 to 0.05 in. diameter.

12. The process of claim 7 wherein the openings of larger size in the second cathode screening portion are of reduced size compared to adjacent areas of higher density of features electroplated.

13. The process of claim 7 further including constructing the second cathode by creating a mesh having openings of different sizes corresponding to the calculation of fraction of area to be plated on the different areas on the plan of features.

* * * * *